(12) United States Patent
Miller et al.

(10) Patent No.: US 9,538,687 B2
(45) Date of Patent: Jan. 3, 2017

(54) HIGH-DENSITY RACK UNIT SYSTEMS AND METHODS

(71) Applicants: Daniel L. Miller, Plano, TX (US); Adam R. Hotchkiss, Richardson, TX (US)

(72) Inventors: Daniel L. Miller, Plano, TX (US); Adam R. Hotchkiss, Richardson, TX (US)

(73) Assignee: Menara Network, Inc., Dallas, TX (US)

( * ) Notice: Subject to any disclaimer, the term of this patent is extended or adjusted under 35 U.S.C. 154(b) by 260 days.

(21) Appl. No.: 13/916,164

(22) Filed: Jun. 12, 2013

(65) Prior Publication Data

US 2014/0369001 A1    Dec. 18, 2014

(51) Int. Cl.
*H05K 7/20* (2006.01)
*H05K 7/14* (2006.01)

(52) U.S. Cl.
CPC ........ *H05K 7/20563* (2013.01); *H05K 7/1425* (2013.01); *Y10T 29/49826* (2015.01)

(58) Field of Classification Search
CPC .............. H05K 7/20563; H05K 7/1425; H05K 7/20727; H05K 7/20718; H05K 7/20736; H05K 7/20572; H05K 7/20136; H05K 7/20145
USPC ......... 361/679.055–679.061, 679.46–679.54, 361/688–723, 788, 724–727
See application file for complete search history.

(56) References Cited

U.S. PATENT DOCUMENTS

| | | | | |
|---|---|---|---|---|
| 5,559,673 A * | 9/1996 | Gagnon | ............. | G06F 1/20 165/122 |
| 5,596,483 A * | 1/1997 | Wyler | ............. | G06F 1/18 361/679.47 |
| 5,865,518 A * | 2/1999 | Jarrett | ............. | G06F 1/181 312/223.2 |
| 6,011,689 A * | 1/2000 | Wrycraft | ............. | G06F 1/20 361/679.31 |
| 6,452,809 B1 | 9/2002 | Jackson et al. | | |
| 6,741,467 B2 | 5/2004 | Coglitore et al. | | |
| 6,751,094 B2 * | 6/2004 | Kolb | ............. | G06F 1/206 312/223.2 |
| 6,813,149 B2 * | 11/2004 | Faneuf | ............. | H05K 7/20727 361/679.49 |
| 6,963,489 B2 * | 11/2005 | Askeland | ............. | G06F 1/182 165/121 |
| 7,050,301 B2 * | 5/2006 | Wong | ............. | H05K 7/20909 165/122 |

(Continued)

*Primary Examiner* — Courtney Smith
*Assistant Examiner* — Matt Dhillon
(74) *Attorney, Agent, or Firm* — Clements Bernard PLLC; Lawrence A. Baratta, Jr.; Christopher L. Bernard (57) ABSTRACT

High-density rack unit systems and methods are described for telecommunication and data communication systems that utilize novel airflow mechanisms thereby enabling modularity and high-density in small-form factor units. The high-density rack unit systems and methods offer novel airflow mechanisms via right-angle backplane connectors to enable more airflow in a rack unit as well as novel field replaceable fans in these high-density rack units. Further, the high-density rack unit systems and methods include a baffle structure to keep power-supply-related airflow separate from the airflow over other components in the 1U or 2U rack unit. In this manner, the high-density rack unit systems and methods enable system vendors and network operators to realize significant density improvements.

17 Claims, 10 Drawing Sheets

(56) References Cited

U.S. PATENT DOCUMENTS

| | | | | |
|---|---|---|---|---|
| 7,126,820 | B2* | 10/2006 | Wei | H04Q 1/15 361/690 |
| 7,209,352 | B2* | 4/2007 | Chen | H05K 7/20727 165/120 |
| 7,224,581 | B2* | 5/2007 | Garnett | G06F 1/183 361/679.49 |
| 7,236,370 | B2 | 6/2007 | Coglitore et al. | |
| 7,324,338 | B1* | 1/2008 | Chi | G06F 1/20 361/679.48 |
| 7,503,804 | B2 | 3/2009 | Minich | |
| 7,508,663 | B2 | 3/2009 | Coglitore et al. | |
| 7,522,426 | B2* | 4/2009 | Koga | H05K 7/1457 361/788 |
| 7,529,097 | B2 | 5/2009 | Coglitore et al. | |
| 7,660,116 | B2 | 2/2010 | Claassen et al. | |
| 7,679,920 | B2* | 3/2010 | Musciano | H05K 7/20727 174/16.1 |
| 7,742,296 | B2* | 6/2010 | Lai | G06F 1/20 165/80.3 |
| 7,894,193 | B2* | 2/2011 | Lai | G06F 1/188 312/223.2 |
| 7,911,785 | B2 | 3/2011 | Coglitore et al. | |
| 8,031,464 | B2 | 10/2011 | Adkins et al. | |
| 8,072,753 | B2* | 12/2011 | Sun | G06F 1/181 361/694 |
| 8,081,444 | B2* | 12/2011 | Xiao | G06F 1/20 312/223.2 |
| 8,154,867 | B2* | 4/2012 | Shearman | H05K 7/20572 312/236 |
| 8,164,901 | B2 | 4/2012 | Neudorfer | |
| 8,199,501 | B2* | 6/2012 | Sawai | G06F 1/20 165/104.33 |
| 8,259,450 | B2 | 9/2012 | Dunwoody et al. | |
| 8,274,792 | B2 | 9/2012 | Soffer | |
| 8,320,125 | B1 | 11/2012 | Hamburgen et al. | |
| 8,369,321 | B2 | 2/2013 | Aybay | |
| 8,411,440 | B2 | 4/2013 | Dunwoody et al. | |
| 8,432,689 | B2 | 4/2013 | Coglitore et al. | |
| 8,441,792 | B2 | 5/2013 | Dunwoody et al. | |
| 8,477,491 | B1* | 7/2013 | Ross | H05K 7/20736 361/679.48 |
| 8,737,067 | B1* | 5/2014 | Kim | H05K 7/1492 342/175 |
| 2003/0124971 | A1* | 7/2003 | Williams | G06F 1/20 454/184 |
| 2004/0221604 | A1* | 11/2004 | Ota | H05K 7/20781 62/259.2 |
| 2007/0097659 | A1 | 5/2007 | Behrens et al. | |
| 2008/0055847 | A1* | 3/2008 | Belady | H05K 1/14 361/679.49 |
| 2008/0113603 | A1* | 5/2008 | Atallah | G06F 1/20 454/184 |
| 2010/0134967 | A1* | 6/2010 | Gaub | H05K 1/14 361/679.21 |
| 2011/0019352 | A1 | 1/2011 | Kwon et al. | |
| 2012/0270492 | A1 | 10/2012 | Kilkenny et al. | |
| 2013/0063888 | A1 | 3/2013 | Wang | |

\* cited by examiner

HIGH-DENSITY RACK UNIT SYSTEMS AND METHODS

FIELD OF THE DISCLOSURE

The present disclosure relates generally to telecommunication and data communication systems and methods. More particularly, the present disclosure relates to high-density rack unit systems and methods for telecommunication and data communication systems that utilize novel airflow mechanisms thereby enabling modularity and high-density in small-form factor units.

BACKGROUND OF THE DISCLOSURE

Telecommunication, data communication, high-performance computing, and the like systems are typically deployed in physical hardware shelves that are rack mounted in racks or frames. For example, typical racks or frames are either 19 or 23 inches in practice. A rack unit (abbreviated as U or RU) is a unit of measure describing the height of equipment intended for mounting in a rack or frame. For example, 1U piece of equipment would take up one rack unit of space in height; a 2U would take up two rack units of space in height, etc. As technology improves and network/computing power increases, the drive is towards smaller and smaller deployments with more functionality and performance. For example, one type of rack configuration is known as a "pizza box" form factor. This is a common design for computers, networking devices, etc. This rack configuration is typically wide and flat, such as 1U or 2U high, thus resembling pizza boxes. Of note, the pizza box form factor is typically an integrated device without modularity. Further, the pizza box form factor or other small RU configurations are constrained by size and cooling constraints. That is, as density increases along with functionality, smaller-sized hardware experiences significant heating issues. There exists a need to accommodate higher-density, smaller-sized hardware via unique cooling mechanisms.

Figure 1:
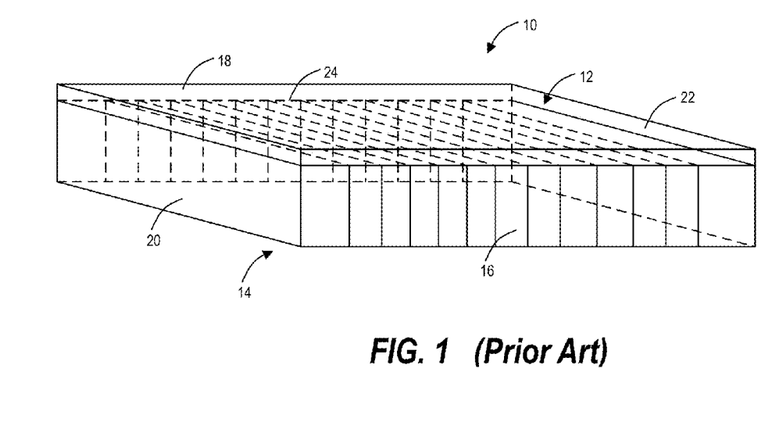
FIG. 1 is a schematic diagram of a conventional rack unit.

Referring to FIG. 1, in a conventional embodiment, a schematic diagram illustrates a conventional rack unit 10. The conventional rack unit 10 can be a 1U or 2U rack unit, a pizza box form factor, etc. The conventional rack unit 10 generally includes six sides including a top side 12, a bottom side 14, a front side 16, a back side 18, a left side 20, and a right side 22. In a rack-mounted configuration, the left and right sides 20, 22 can be attached in some manner to a rack. The conventional rack unit 10 includes a backplane 24 that is located at or near the back side 18. In this manner, electronics, optics, and other circuitry, hardware, logic, etc. is located within the conventional rack unit 10 and physically connected to the backplane 24. The backplane 24 is parallel to the front and back sides 16, 18. Disadvantageously, air flow through the conventional rack unit 10 is limited due to the vertical backplane 24 which blocks air flow through the conventional rack unit 100. Thus, as the density increases, air flow becomes problematic as the backplane 24 inhibits air flow through the conventional rack unit 10. Accordingly, density suffers and it is difficult to add more functionality in the conventional rack unit 10. Of note, similar problems occur in conventional systems with vertical midplanes instead of the backplane 24. As described herein, the backplane 24, midplanes, etc. are all generally interslot interconnects, and other types of interslot interconnects are also contemplated in addition to the backplane 24, midplanes, etc.

Additional constraints in conventional systems include:

1) Additional density of ports on faceplates on the front side 16 leads to either greater quantity of traces on the backplane 24 and greater quantity of pins on the connectors soldered to the backplane 24, hence bloating the size of the backplane 24 due to routing of traces or of larger connectors;

2) With respect to drastically increasing the quantity of layers in the backplane's 24 printed circuit board (PCB), this is difficult because cost increases super-linearly faster than the increase in quantity of layers;

3) With respect to drastically increasing the bandwidth of each trace in the backplane 24 and pin in each backplane-connector, this is difficult because cost may be prohibitive and/or beyond the current state of the art of Gb/s per bidirectional serializer-deserializer (SerDes) lane; and 4) With respect to drastically shrinking the size of the connectors on the backplane 24, this is difficult because the already rather high Gb/s per bidirectional SerDes lane needs some form of dielectric to eliminate crosstalk and other negative analog effects. If anything, the next generation of higher-bandwidth (-per-pin) connectors are becoming less-dense, not more-dense, to accommodate this additional dielectric material, whether it be plastic or air or other substance. Hence, the challenges tend to worsen over time, not improve.

BRIEF SUMMARY OF THE DISCLOSURE

In an exemplary embodiment, a rack unit system includes a physical housing including a front side, a back side, a left side, and a right side, wherein the left side and the right side are configured to connect to a rack; bottom-plane connections located at or near the back side, wherein the bottom-plane connections interface to right-angle connections on associated bottom-plane circuit boards connecting the associated circuit boards therebetween, and wherein the associated bottom-plane circuit boards are in a horizontal plane inside the physical housing; and a plurality of openings in the back side located in substantially unobstructed portions of the back side thereby enabling airflow through the physical housing. The rack unit system can further include top-plane connections located at or near the back side, wherein the top-plane connections interface to right-angle connections on associated top-plane circuit boards connecting the associated top-plane circuit boards therebetween, and wherein the top-plane associated circuit boards are in a horizontal plane inside the physical housing The rack unit system can further include connections disposed on or attached to the physical housing communicatively coupling the top-plane connections and the bottom-plane connections therebetween. The bottom-plane connections can include a combination of pin connectors and socket connectors.

The rack unit can include a 1U or 2U rack unit with a modular configuration of the associated circuit boards. The 1U or 2U rack unit can include an Ethernet switch. The rack unit system can further include at least one slot attached to or formed on the back side; and a connector in the at least one slot for receiving a selectively insertable cooling unit, wherein the cooling unit facilitates airflow through the plurality of openings in the back side and a plurality of openings in the left side, the right side, and the front side. The selectively insertable cooling unit can include a field replaceable fan, and wherein the connector facilitates power and alarm data between the rack unit and the field replaceable fan. The rack unit system can further include a power supply located internal to the physical housing; and a baffle blocking airflow from the front side from the power supply such that airflow from the power supply is disjoint from airflow associated with the bottom-plane circuit boards. The rack unit system can further include a second set of a plurality of openings disposed near the power supply drawing in airflow for the power supply such that the airflow avoids the associated circuit boards.

In another exemplary embodiment, a modular system includes a housing including a front side, a back side, a left side, a right side, a top side, and a bottom side; top-plane connections located at or near the back side and the top side; bottom-plane connections located at or near the back side and the bottom side, wherein the top-plane connections and the bottom-plane connections leave the back side substantially unobstructed for airflow therethrough; at least one module including a first right-angle connector configured to interface to one of the bottom-plane connections and a second right-angle connector configured to interface to one of the top-plane connections; and a plurality of openings in the back side located in substantially unobstructed portions of the back side thereby enabling airflow through the housing. The various vertical heights of the housing may include a 1U or 2U rack unit. The top-plane connections can include data connections and the bottom-plane connections can include power connections. The top-plane connections can include pin connectors and the bottom-plane connections can include socket connectors.

The modular system can further include at least one slot attached to or formed on the back side; and a connector in the at least one slot for receiving a field replaceable fan, wherein the field replaceable fan facilitates airflow through the plurality of openings in the back side and a plurality of openings in the left side, the right side, and the front side. The modular system can further include a power supply located internal to the housing; a baffle blocking airflow from the front side from the power supply; and a second set of a plurality of openings disposed near the power supply drawing in airflow for the power supply such that the airflow avoids the at least one module.

In yet another exemplary embodiment, a method includes inserting a module including a pair of right-angle connectors thereon into a high-density 1U or 2U rack unit; connecting the module via the pair of right-angle connectors to connections in the high-density 1U or 2U rack unit, wherein the pair of connections in the high-density 1U or 2U rack unit leave a substantial portion of a back side of the high-density 1U or 2U rack unit unobstructed for airflow, because the PCB's thin edge is the minimal obstruction remaining for interslot interconnect; and operating a selectively insertable cooling unit at or near the back side to draw airflow through the high-density 1U or 2U rack unit through the unobstructed substantial portion of the back side.

BRIEF DESCRIPTION OF THE DRAWINGS

The present disclosure is illustrated and described herein with reference to the various drawings, in which like reference numbers are used to denote like system components/method steps, as appropriate, and in which:

FIG. 15 is a schematic diagram of a top view of a 1U rack unit with a bottom-plane only configuration showing airflow separation from high power components such as power supplies and the like.

DETAILED DESCRIPTION OF THE DISCLOSURE

In various exemplary embodiments, high-density rack unit systems and methods are described for telecommunication and data communication systems that utilize novel airflow mechanisms thereby enabling modularity and high-density in small-form factor units. The objective of the high-density rack unit systems and methods is to enable 1U or 2U rack units or the like to have similar functionality and density as current rack units that take up many more rack units of space. That is, as density improves, cooling is the limiting factor in dense rack units. The high-density rack unit systems and methods offer novel airflow mechanisms via right-angle top-plane and/or bottom-plane connectors to enable more airflow in a rack unit as well as novel field replaceable fans in these high-density rack units. Further, the high-density rack unit systems and methods include a baffle structure to vent heat generated by the front slots in the 1U or 2U rack unit away from each power supply's internals, so that the airflow within the power supply can be lessened so that in turn the fan within each power supply is sized minimally to reduce cost without adversely lessening the lifetime of the power supply. In this manner, the high-density rack unit systems and methods enable system vendors and network operators to realize significant density improvements.

Specifically, the high-density rack unit systems and methods replace conventional backplane or midplane connectors on vertical backplanes or midplanes which what are referred to as top-plane and/or bottom-plane connectors. In this manner, modules, line cards, PCBs, etc. are inserted into the 1U or 2U rack units with a horizontal orientation (relative to a top and bottom of the 1U or 2U rack units). In an exemplary embodiment, the high-density rack unit systems and methods can include a single set of bottom-plane connectors. Here, the single set of bottom-plane connectors provide the same functionality (e.g., data and power) as conventional midplane or backplane connectors. In another exemplary embodiment, the high-density rack unit systems and methods can include a set of top-plane connectors and/or a set of bottom-plane connectors. An innovative aspect of this exemplary embodiment includes two PCBs, each parallel to a top and bottom of a chassis. Effectively these top-plane and bottom-plane PCBs are effectively a midplane (conceptually-)'split' into two perhaps-unequal-sized portions (as measured vertically) and then rotated 90 degrees to be parallel to the top and bottom of the chassis. Here, the top-plane is one portion of the midplane functionality and the bottom-plane is the other portion of the midplane functionality.

Figure 2:
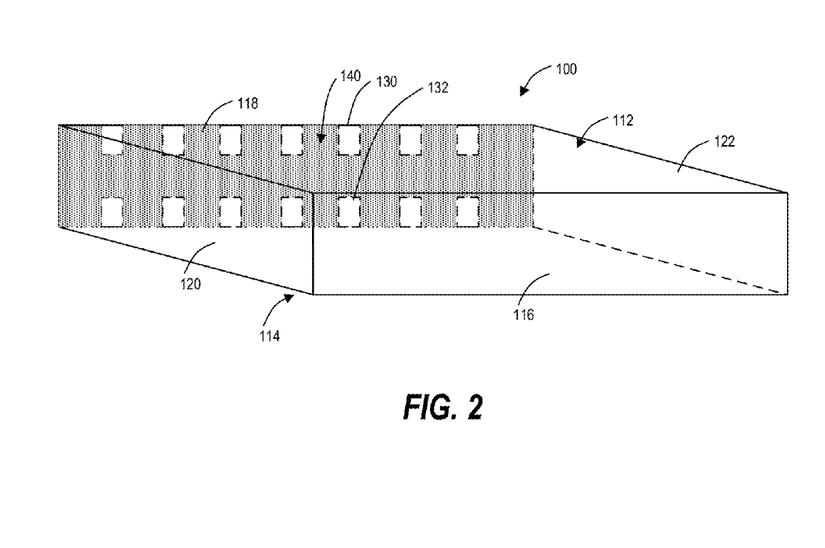
FIG. 2 is a schematic diagram of a rack unit with novel airflow mechanisms based on a right angle connection scheme.

Referring to FIG. 2, in an exemplary embodiment, a schematic diagram illustrates a rack unit 100 with novel airflow mechanisms. In an exemplary embodiment, the rack unit 100 can be a 1U or 2U rack unit, a pizza box form factor, any narrow electronics or optics enclosure, etc. Of course, other exemplary embodiments are contemplated consistent with the foregoing descriptions. The rack unit 100 generally includes six sides of a physical housing including a top side 112, a bottom side 114, a front side 116, a back side 118, a left side 120, and a right side 122. Similar to the conventional rack unit 10, the left and right sides 120, 122 can be attached in some manner to a rack in a rack-mounted configuration. Unlike, the conventional rack unit 10, the rack unit 100 includes a 90° right angle connection scheme for connections on the back side 118. Specifically, the rack unit 100 includes top-plane connections 130 and bottom-plane connections 132. The top-plane connections 130 and the form a right angle bottom-plane connections 132 scheme which is discussed in further detail herein. In this manner, the back side 118 can include open space 140 which is not blocked by a backplane or midplane such as the backplane 24 blocking the back side 118 in the conventional rack unit 10. The open space 140 can include vents or the like thereby enabling significantly more airflow between the front side 116 and the back side 118 relative to the conventional rack unit 10.

Additionally, the rack unit 100 supports modules with PCBs that are in the horizontal plane, i.e. PCBs are parallel to the top side 112 and the bottom side 114. In this manner, airflow is open from the left side 120 to the right side 122 without vertically aligned PCBs inhibiting airflow inside the rack unit 100. The top-plane connections 130 and the bottom-plane connections 132 are referred to as such because the top-plane connections 130 connect to a top-plane PCB and the bottom-plane connections 132 connect to a bottom-plane PCB. Note, the top-plane PCB and the bottom-plane PCB do not necessarily need connections therebetween as these can occur in the rack unit 100 via interconnects between the top-plane connections 130 and bottom-plane connections 132 internally in the rack unit 100. As a corollary, connections for the top-plane PCB are all through the top-plane connections 130 and connections for the bottom-plane PCB are through the bottom-plane connections 132.

Figure 3:
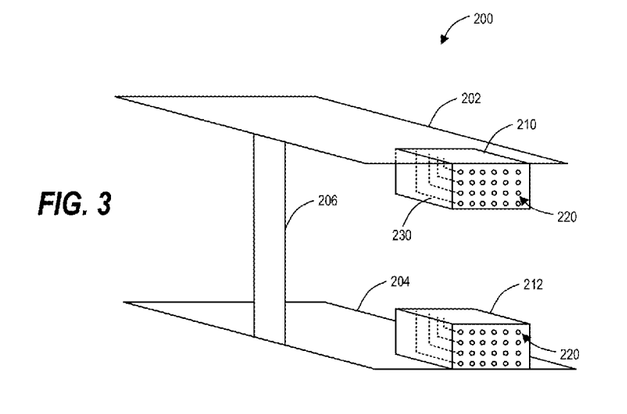
FIG. 3 is a schematic diagram of a module and associated connections for use in the rack unit of FIG. 3.

Referring to FIG. 3, in an exemplary embodiment, a schematic diagram illustrates a module 200 for use in the rack unit 100. The module 200 includes a top circuit board 202 and a bottom circuit board 204. The circuit boards 202, 204 can be printed circuit boards (PCBs) or the like and generally have electronics, optics, circuitry, hardware, pluggable cages, etc., attached or soldered on. Furthermore, the circuit boards 202, 204 can include a connection (or multiple connections) that run between the circuit boards 202, 204 through the top-plane connections 130 and bottom-plane connections 132 for providing power and/or data therebetween. The circuit board 202 includes a right-angle connector 210 and the circuit board 204 includes a right-angle connector 212. The right-angle connector 210 is configured to align with the top-plane connections 130 and the right-angle connector 212 is configured to align with the bottom-plane connections 132.

The right-angle connectors 210, 212 include a plurality of connection points 220 that interface to corresponding connection points in the top-plane connections 130 and the bottom-plane connections 132 to interface power and/or data thereon. The right-angle connectors 210, 212 are constructed to connect each of the plurality of connection points 220 to connections or leads on the circuit boards 202, 204. This is accomplished through a right-angle connection 230 for each of the plurality of connection points 220 internal to the right-angle connectors 210, 212. In this manner, the right-angle connectors 210, 212 convert between the geometry of the circuit boards 202, 204 and the orientation of the top-plane connections 130 and the bottom-plane connections 132. That is, in the conventional rack unit 10, corresponding circuit boards (or line cards, modules, plugs, blades, etc.) are oriented in the same plane at about right angles to the backplane 24. In the rack unit 100, the circuit boards 202, 204 are in a vertical plane.

Figure 4:
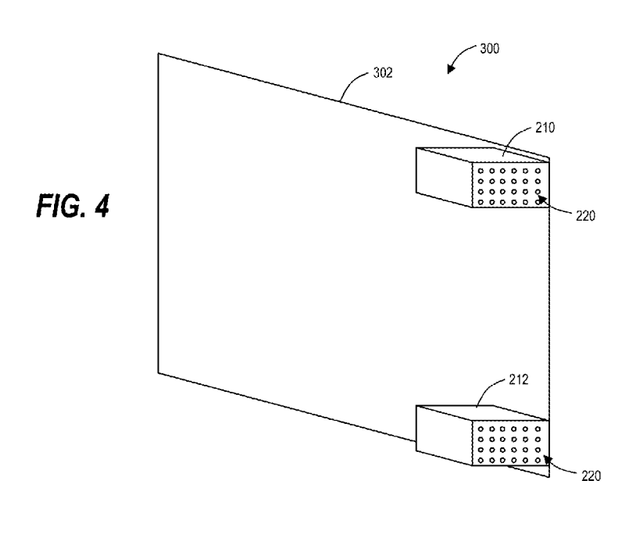
FIG. 4 is a schematic diagram of another module and associated connections for use in the rack unit of FIG. 3.

Referring to FIG. 4, in another exemplary embodiment, a schematic diagram illustrates another module 300 for use in the rack unit 100. The module 300 includes a single circuit board 302. The circuit board 302 can be a printed circuit board (PCB) or the like and generally includes electronics, optics, circuitry, hardware, etc. Similar to the module 200, the module 300 includes the right-angle connectors 210, 212. Since the circuit board 302 is a single board, it can include connections, leads, etc. between the right-angle connectors 210, 212 on the circuit board 302. The right-angle connectors 210, 212 can function in a similar manner as described herein with respect to the module 200. However, the right-angle connectors 210, 212 in the module 300 have different orientations of the associated right-angle connection 230 for each of the plurality of connection points 220 internal to the right-angle connectors 210, 212. In the module 300, the circuit board 302 is in the same plane as the backplane, but the backplane is significantly reduced in surface area due to the use of the right-angle connectors 210, 212 and the top-plane connections 130 and the bottom-plane connections 132.

In an exemplary embodiment, each of the top-plane connections 130 and the bottom-plane connections 132 can be a combination of male type pin connectors and female type socket connectors. For example, the male type pin connectors can have data connections thereon and the female type socket connectors can have power connections thereon. In another exemplary embodiment, the top-plane connections 130 can be male type connectors with only data connections thereon and the right-angle connector 210 can be female type connectors receiving the male type connectors. The bottom-plane connections 132 can be female type connectors such as a socket for power and optionally data connections and the right-angle connector 212 can be a male type connector. This is because having male type connectors for power can be problematic if pins are smashed against different-voltage power-supply pins, against ground pins, or against data-signal pins. Smashed data-signal pins are generally not a fire-safety.

Figure 5:
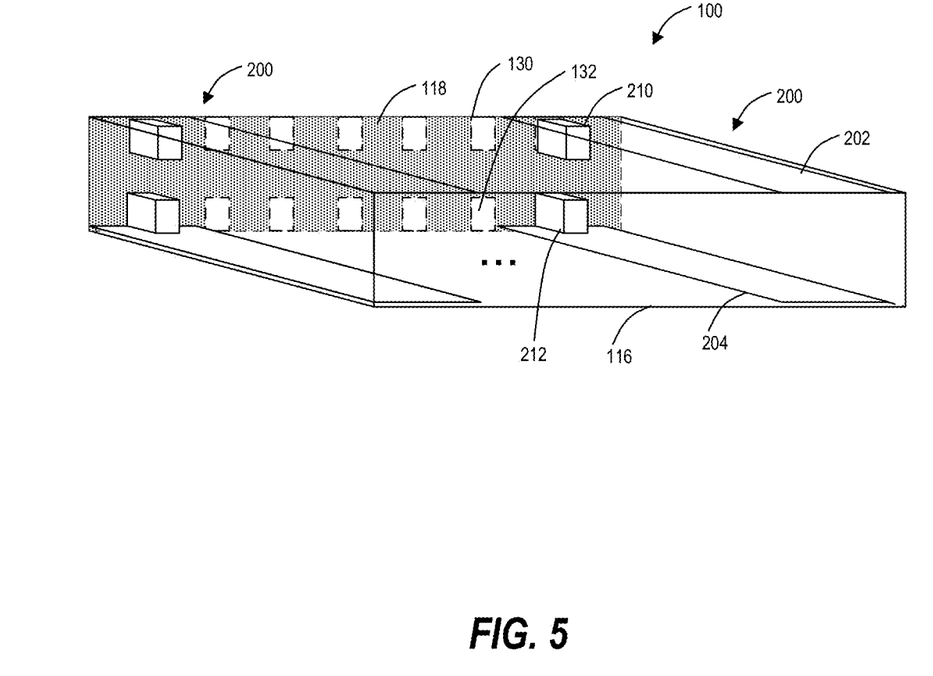
FIG. 5 is a schematic diagram of the rack unit of FIG. 2 with exemplary circuit boards contained therein forming a modular system.

Referring to FIG. 5, in an exemplary embodiment, a schematic diagram illustrates the rack unit 100 with exemplary circuit boards 200 contained therein forming a modular system. Here, the circuit boards 200 can be modules, line cards, pluggables, blades, and the like that are selectively insertable in the rack unit 100 through the front side 116 or the like. Each of the circuit boards 200 can perform a set of functionality and different circuit boards 200 can be included as needed for a modular configuration of the rack unit 100. In an exemplary embodiment, the rack unit 100 is a 1U or 2U Ethernet switching device that supports various data rates and protocols based on different circuit boards 200. For example, the circuit boards 200 can include various Ethernet ports formed via multi-source agreement (MSA) based pluggable optical transceivers. The circuit boards 200 can also include switching functionality that performs packet switching between the various ports. For example, the switching functionality can switch packets locally between the ports on each circuit board 200 as well as being communicatively coupled to other circuit boards 200 for switching packets across the backplane. In this manner, the rack unit 100 is modular while being dense in a 1U or 2U configuration. While FIG. 5 illustrates the rack unit 100 with the circuit boards 200, those of ordinary skill in the art will recognize that the rack unit 100 can also support the circuit boards 300 and the like as well.

The circuit boards 200 are oriented horizontally within the rack unit 100 and the top-plane connections 130 and the bottom-plane connections 132 couple the circuit boards 200 via the right-angle connectors 210, 212. Components and the like on the circuit board 200 are also oriented horizontally within the rack unit 100. As such, air flow is greatly increased within the rack unit 100 since there are not PCBs oriented vertically creating barriers for air within the rack unit 100. In this manner, all of the circuit boards 200 share common airflow and the airflow has significant more effective area as compared to conventional midplane and backplane configurations with the PCBs oriented vertically.

Figure 6:
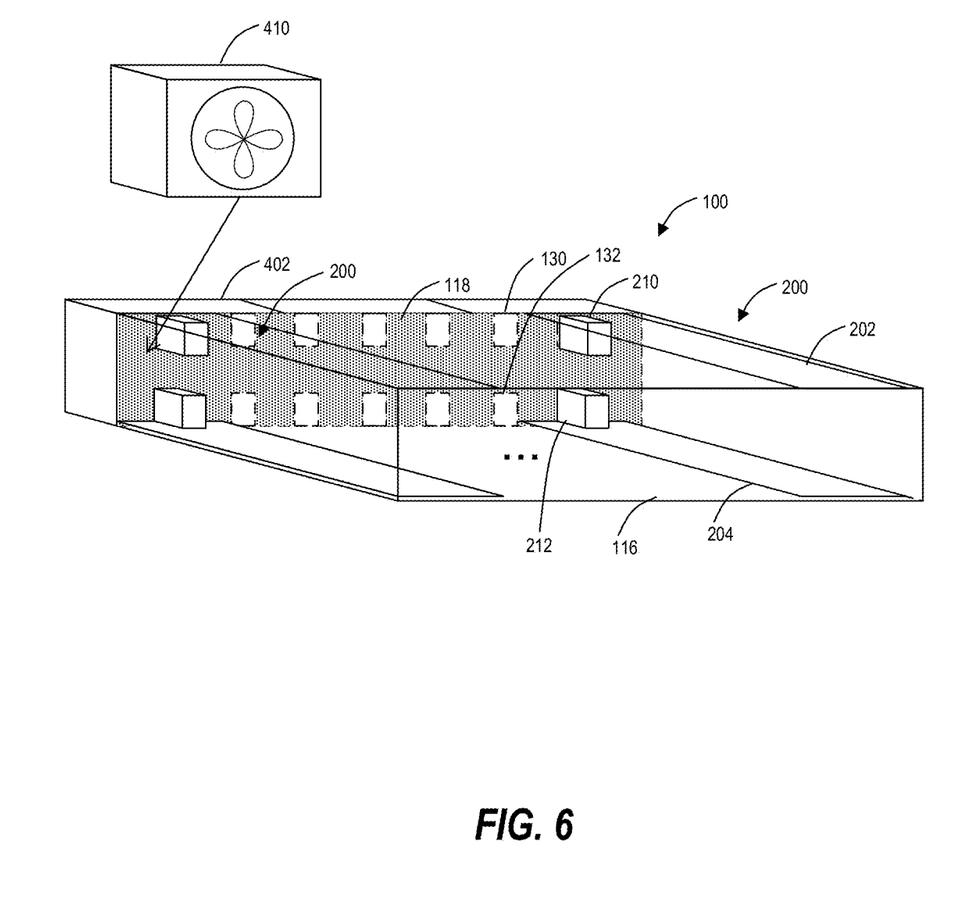
FIG. 6 is a schematic diagram of the rack unit of FIG. 2 with exemplary circuit boards contained therein illustrating a cooling and airflow mechanism.

Referring to FIG. 6, in an exemplary embodiment, a schematic diagram illustrates the rack unit 100 with exemplary circuit boards 200 contained therein illustrating a cooling and airflow mechanism. As described herein, the back side 118 of the rack unit 100 includes significant open space due to the top-plane connections 130, the bottom-plane connections 132, and the right-angle connectors 210, 212. Thus, air can flow much more freely between the front side 116 and the back side 118. In an exemplary embodiment, the back side 118 includes a grill, grate, etc., i.e. any type of openings in a physical housing of the rack unit 100 allowing air flow therethrough. Additionally, the other sides 112, 114, 116, 120, 122 can also include a plurality of openings. In an exemplary embodiment, the air flow mechanisms include a housing 400 with one or more slots 402 attached to or formed with the back side 118. Each of the slots 402 is configured to receive a selectively pluggable cooling module 410. The cooling modules 410 are configured to be field replaceable. The cooling modules 410 include one or more pins that interface to the one or more slots for receiving power and instructions such as when to turn on/off.

In an exemplary embodiment, the cooling modules 410 can be fans that create airflow between the front side 116 and the back side 118 through the rack unit 100. Of note, fans or other types of cooling devices have limited operational life. In fact, mean times to failure of fans are significantly lower than other electronics and components associated with the rack unit 100 because the mean time to repair (MTTR) is approximately the same for any FRU: tens of seconds if the FRU is in stock and technicians are on-site. Conversely, the mean time to failure (MTTF) of different components varies from tens of thousands of hours to millions of hours. Thus, in the high-density rack unit systems and methods, the cooling modules 410 are treated as an operational item, i.e. a consumable operational expense, that is individually replaceable in the field. In this manner, fan failures do not lead to failure of the rack unit 100 or of power-supply FRUs 610. Instead, a fan failure can raise an alarm or warning which directs operational personnel to replace the module with a spare unit.

Figure 7:
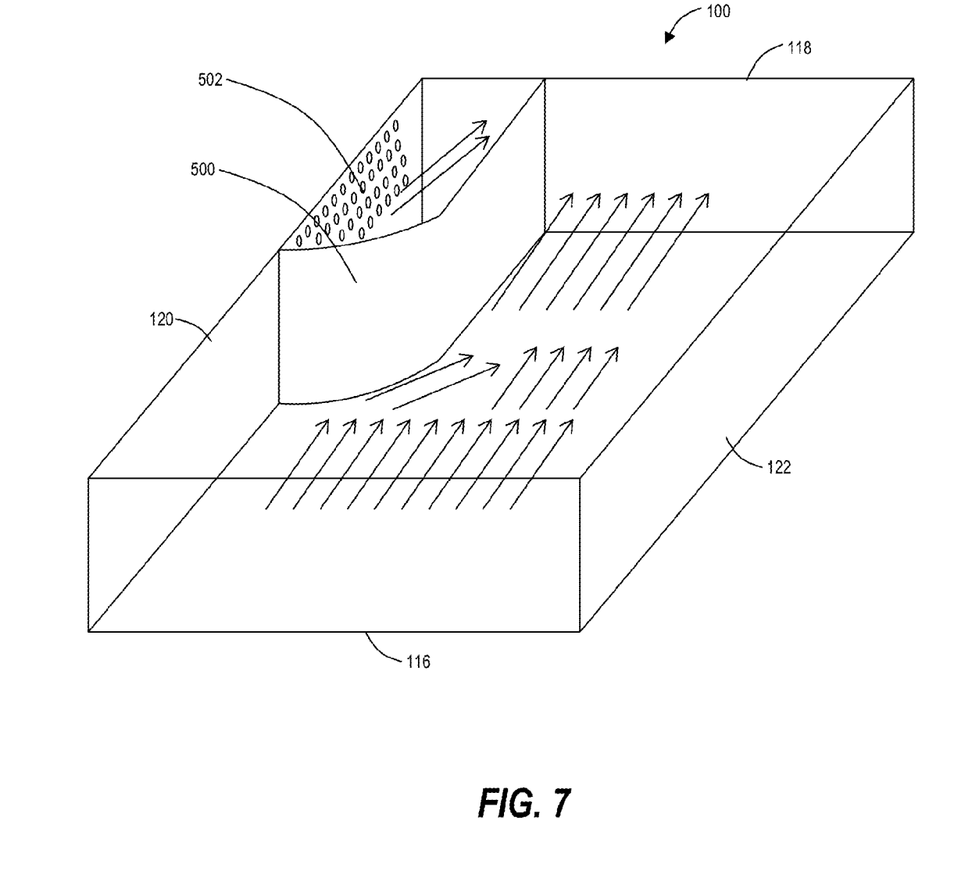
FIG. 7 is a schematic diagram of the rack unit of FIG. 2 with novel internal airflow mechanisms.

Referring to FIG. 7, in an exemplary embodiment, a schematic diagram illustrates the rack unit 100 with novel internal airflow mechanisms. Specifically, the rack unit 100 can include modular power supply equipment or the like (not shown) which generates significant amounts of heat. The novel internal airflow mechanisms utilize a baffle 500 that separates or isolates heat from this equipment from the rest of the equipment or circuit board 200, 300 in the rack unit. Additionally, the rack unit 100 includes openings 502 for fresh air to enter and circulate from the left side 122 to the back side 118. For example, the back side can include the cooling modules 410 which draw through air. In this manner, airflow from the high heat components such as the power supply equipment is outside of the circulation of airflow associated with the circuit boards 200, 300 and does not interfere and raise the temperature of those components and vice versa. Specifically, a power-supply's airflow never comingles with the telecom-functionality airflow within the chassis, because they are kept sealed and disjoint.

Figure 8:
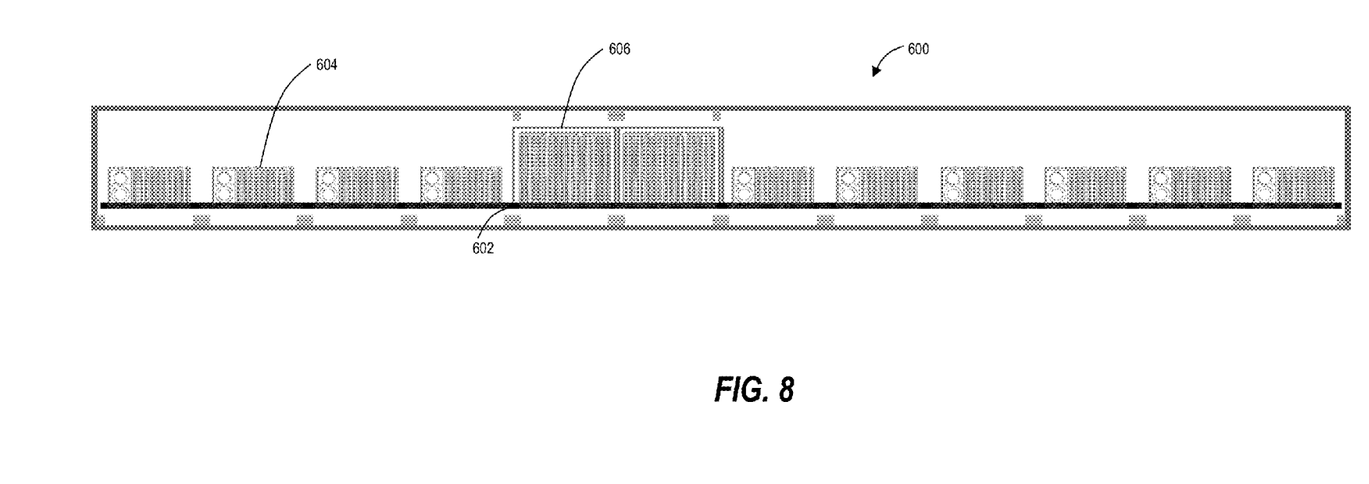
FIG. 8 is a schematic diagram of a front view of a 1U rack unit with a bottom-plane only configuration with novel internal airflow mechanisms.
Figure 9:
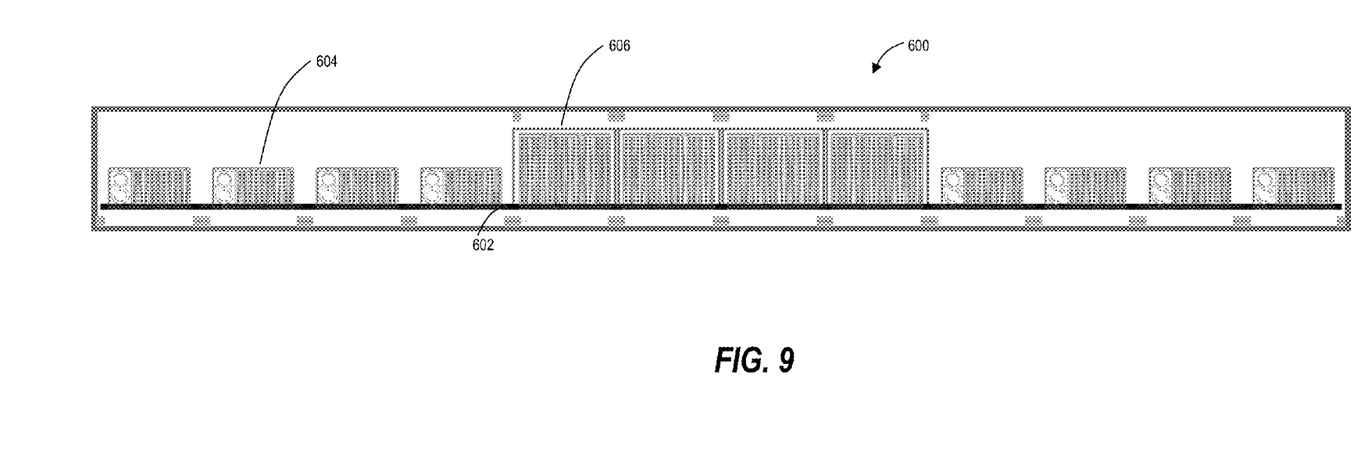
FIG. 9 is a schematic diagram of a front view of another 1U rack unit with a bottom-plane only configuration with novel internal airflow mechanisms.

Referring to FIGS. 8-14, in various exemplary embodiments, schematic diagrams illustrate a rack unit 600 with a set of single bottom-plane connections 132. The rack unit 600 can be functionally similar to the rack unit 100 without the top-plane connections 130. FIGS. 8 and 9 are schematic diagrams of a front view of a 1U rack unit with a bottom-plane only configuration using a bottom-plane PCB 602 that connects to bottom-plane connections 604, 606. For example, the bottom-plane connections 604 can include 120 pins whereas the bottom-plane connections 606 can include 288 pins, although other configurations are contemplated herein. Further, the bottom-plane connections 604, 606 can include female connectors for power and male connectors for data, or female connectors for both power and data.

In an exemplary embodiment, the bottom-plane connections 604 are smaller than the bottom-plane connections 606 with the bottom-plane connections 604 used for line modules and the bottom-plane connections 606 used for switch modules. For example, the switch modules may require greater bandwidth communicating to all of the line modules thereby requiring larger connectors. The switch modules and the line modules can be for Ethernet or the like. In the example of FIG. 8, the rack unit 600 can support two switch modules and ten line modules. In the example of FIG. 9, the rack unit can support four switch modules and eight line modules. Those of ordinary skill in the art will recognize the switch modules and line modules are for illustration purposes only, and these could be any type of modules with the bottom-plane connections 604 being less connectors than the bottom-plane connections 606.

Figure 10:
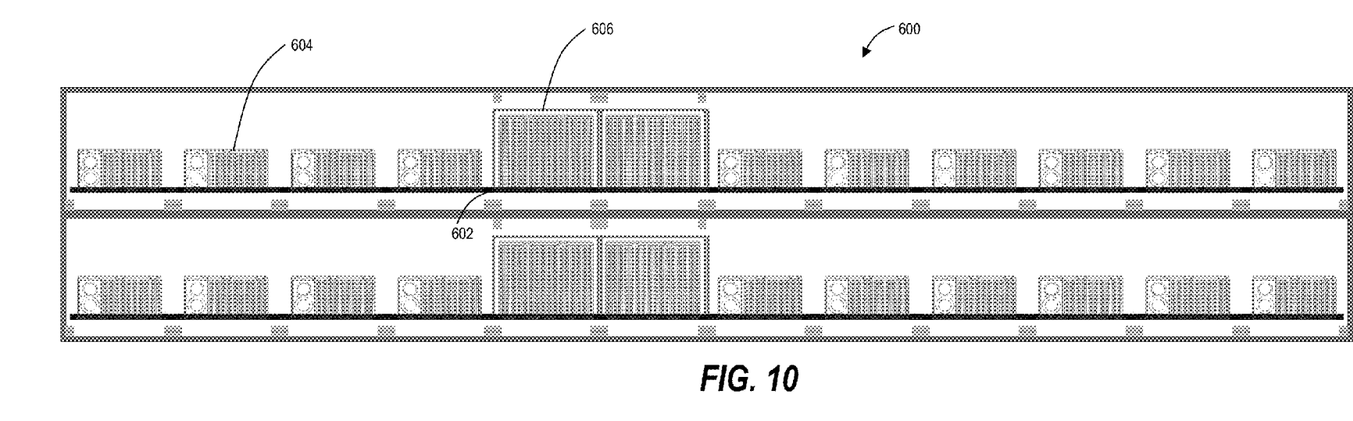
FIG. 10 is a schematic diagram of a front view of a 2U rack unit with a bottom-plane only configuration with novel internal airflow mechanisms.
Figure 11:
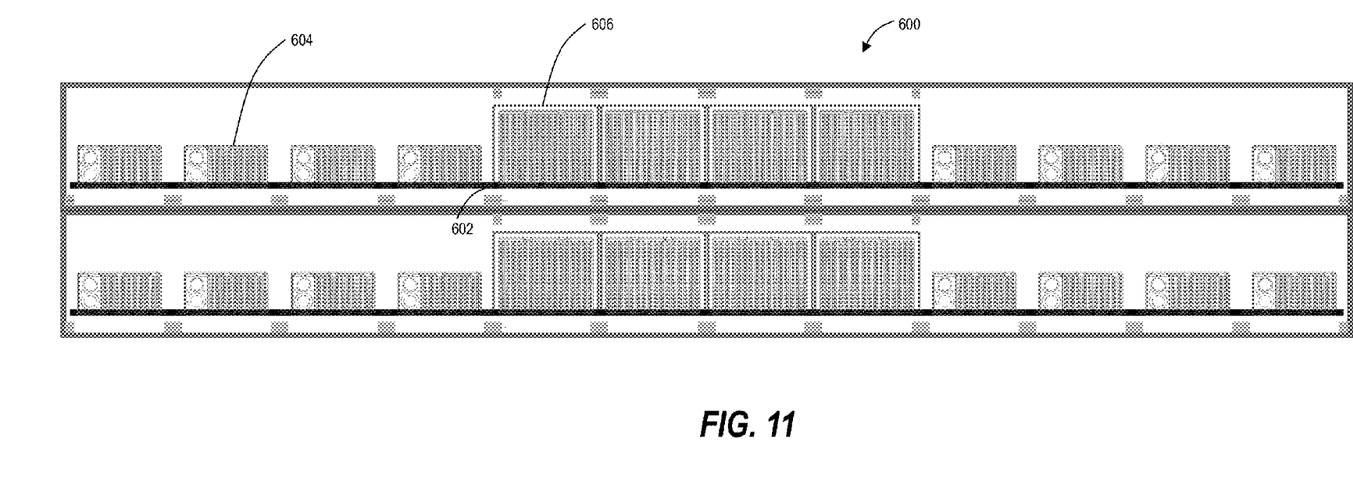
FIG. 11 is a schematic diagram of a front view of another 2U rack unit with a bottom-plane only configuration with novel internal airflow mechanisms.
Figure 12:
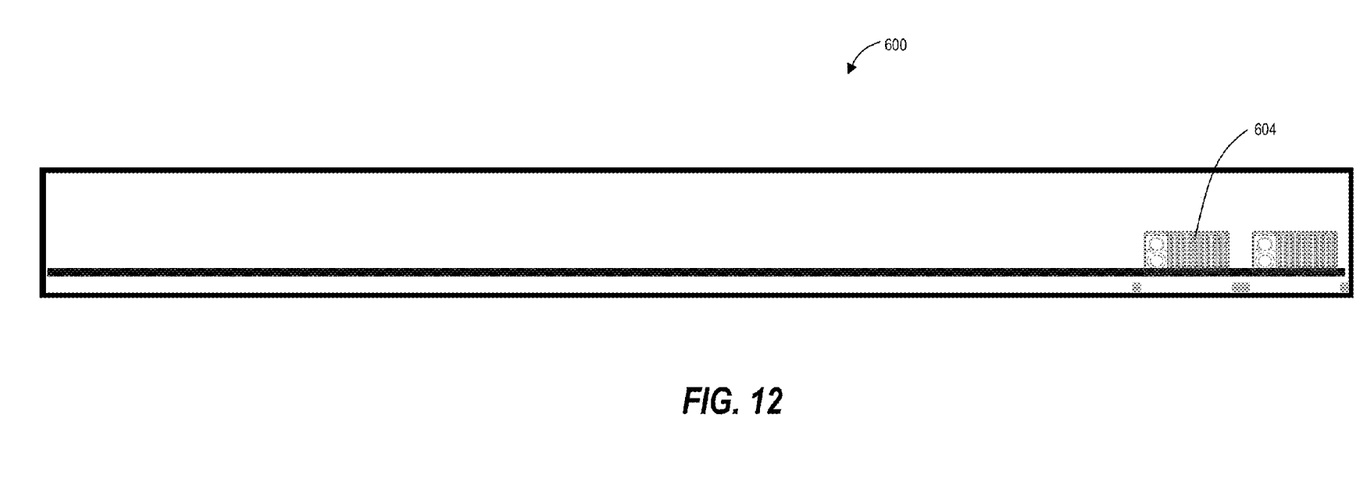
FIG. 12 is a schematic diagram of a front view of yet another 1U rack unit with a bottom-plane only configuration with novel internal airflow mechanisms.

FIGS. 10 and 11 are schematic diagrams of a front view of a 2U rack unit with a bottom-plane only configuration using a bottom-plane PCB 602 that connects to bottom-plane connections 604, 606. Of note, FIG. 10 is similar to FIG. 8 with two levels, and FIG. 11 is similar to FIG. 9 with two levels. FIG. 12 is a schematic diagram of a front view of yet another 1U rack unit using a bottom-plane PCB 602 that connects to bottom-plane connections 604. The example of FIG. 12 can be for a smaller system than the systems in FIGS. 8-11 since FIG. 12 includes only two of the bottom-plane connections 604.

Figure 13:
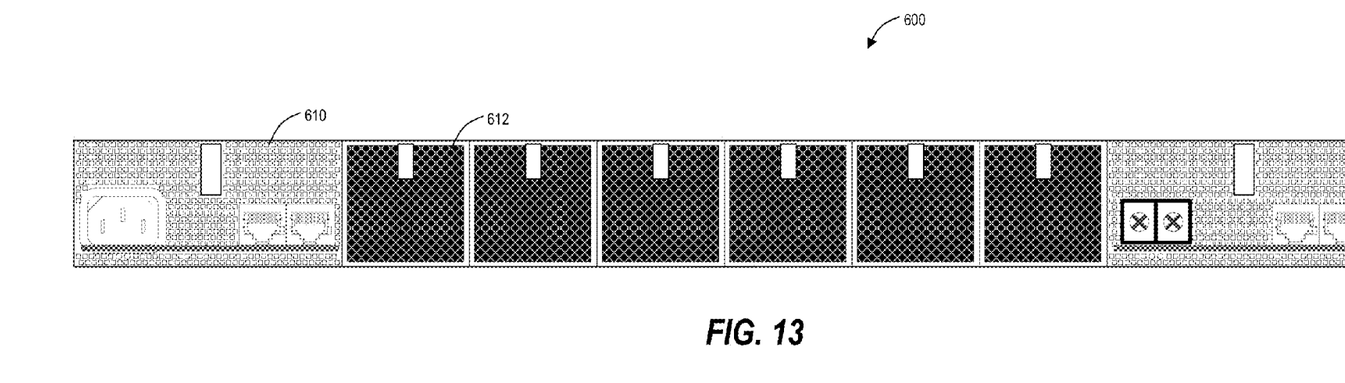
FIG. 13 is a schematic diagram of a rear view of a 1U rack unit with a bottom-plane only configuration with novel internal airflow mechanisms.
Figure 14:
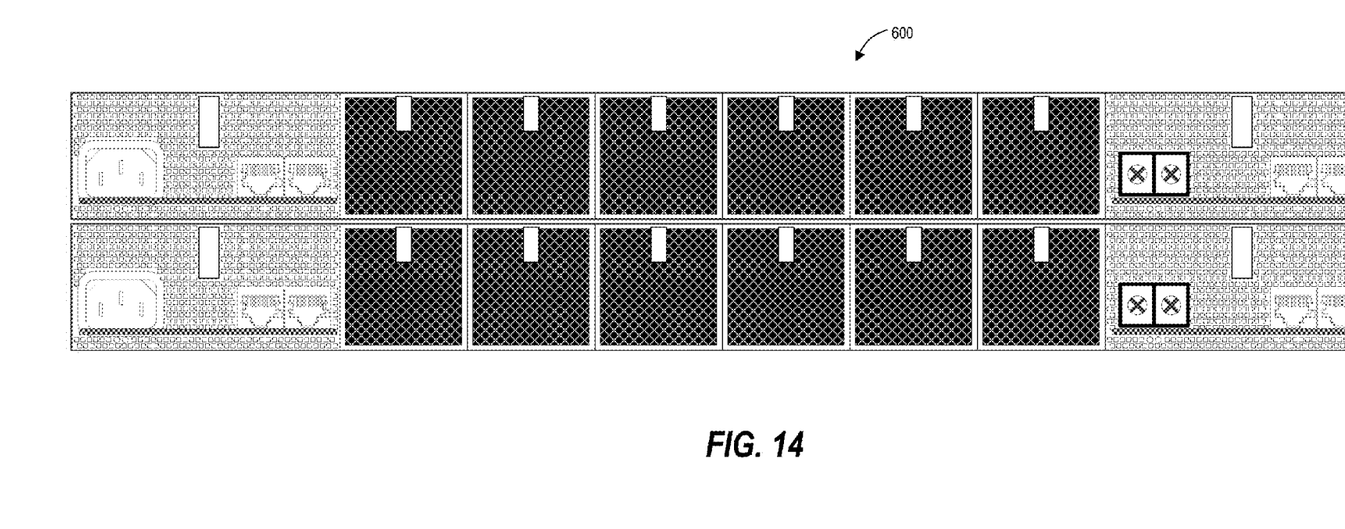
FIG. 14 is a schematic diagram of a rear view of a 2U rack unit with a bottom-plane only configuration with novel internal airflow mechanisms.

FIGS. 13 and 14 are schematic diagrams of a rear view of a 1U rack unit with a bottom-plane only configuration with novel internal airflow mechanisms. Specifically, FIG. 13 can be a rear view of the examples of FIGS. 8-9 and 12, and FIG. 14 can be a rear view of the examples of FIGS. 10-11. Here, the rack unit 600 can include 1+1 protected power supplies 610 which include a power connection as well as telemetry such as via Ethernet ports and six consumable fan tubes 612 for field-replaceable fan units as described herein.

Figure 15:
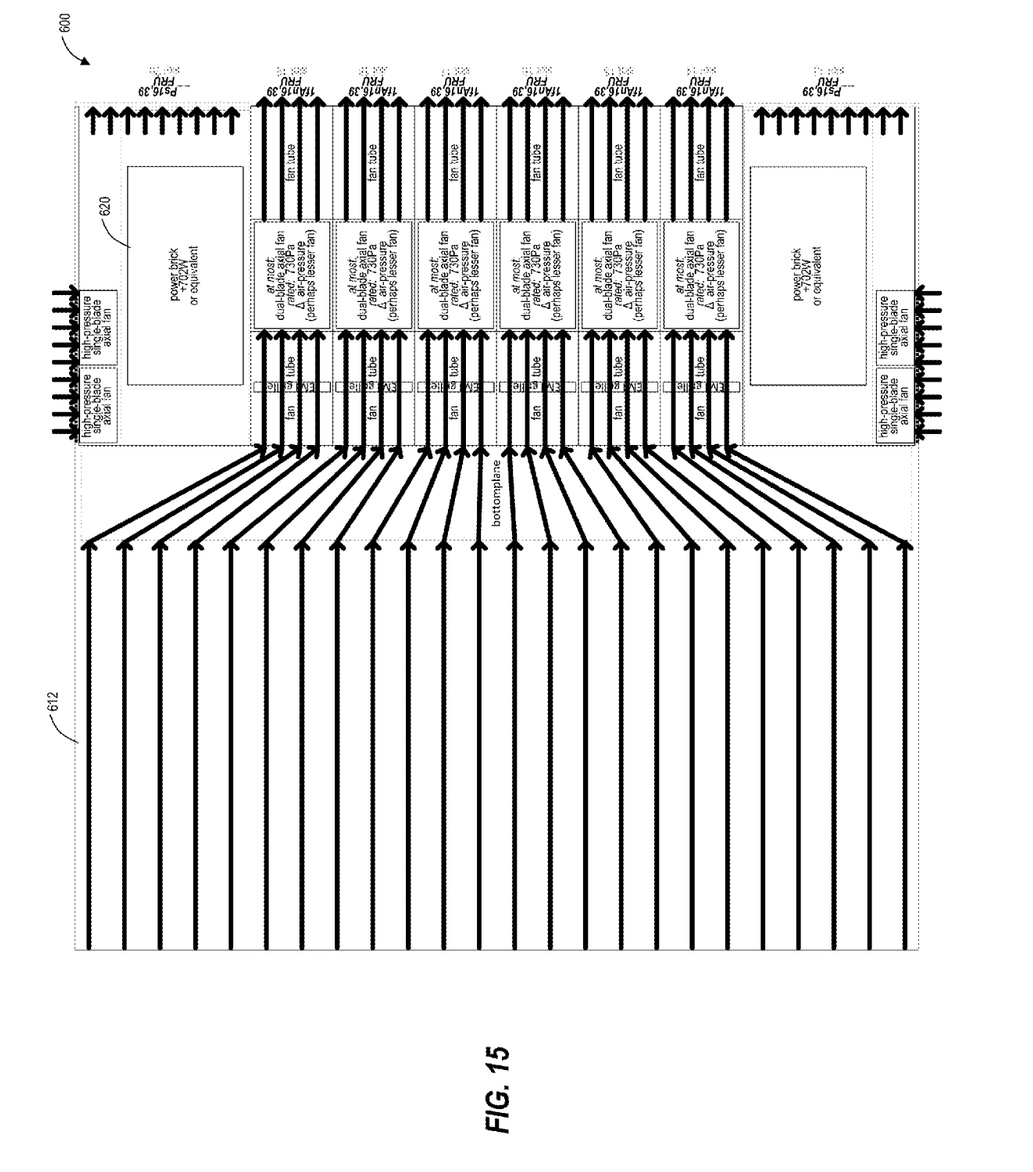

FIG. 15 is a schematic diagram of a top view of a 1U rack unit with a bottom-plane only configuration showing airflow separation from high power components such as power supplies and the like. FIG. 15 illustrates a similar configuration as FIG. 7 with dual 1+1 power supplies that are kept out of the airflow associated with the bottom-plane PCB 602 and its components. Note, the power supplies can be modular and field-replaceable. For example, the rack unit 600 can include power bricks 620 which are cooled via high-pressure single-blade axial fans on sides of the rack unit 600 that create airflow to the back of the rack unit 600. The components inside the rack unit, i.e. on the bottom-plane PCB 602 can be cooled via dual-blade, field replaceable axial fans that create airflow, separate from the power bricks 620, from the front to the back of the rack unit 600. The high-pressure single-blade axial fans can also be field replaceable.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A rack unit system, comprising:
   a physical housing comprising a front side, a back side, a left side, and a right side, wherein the left side and the right side are configured to connect to a rack, wherein the physical housing comprising 1RU (Rack Unit) or 2RU of height;
   bottom-plane connections located at or near the back side, wherein the bottom-plane connections interface to right-angle connections on associated bottom-plane circuit boards connecting the associated bottom-plane circuit boards to one another and wherein the associated bottom-plane circuit boards are in a horizontal plane inside the physical housing; and
   a first plurality of openings in the back side located in substantially unobstructed portions of the back side thereby enabling airflow through the physical housing;
   a power supply located internal to the physical housing, wherein the power supply is located in the horizontal plane with the associated bottom-plane circuit boards;
   a second plurality of openings located on either the left side or the right side for providing enabling airflow through the physical housing over the power supply; and
   a baffle blocking airflow from the front side from the power supply such that airflow from the power supply is disjoint from airflow associated with the associated bottom-plane circuit boards, wherein the baffle is located from a top side to a bottom side of the physical housing.

2. The rack unit system of claim 1, further comprising:
   top-plane connections located at or near the back side, wherein the top-plane connections interface to right-angle connections on associated top-plane circuit boards connecting the associated top-plane circuit boards to one another, and wherein the top-plane associated circuit boards are in a horizontal plane inside the physical housing.

3. The rack unit system of claim 2, further comprising:
   connections disposed on or attached to the physical housing communicatively coupling the top-plane connections and the bottom-plane connections to one another.

4. The rack unit system of claim 1, wherein the bottom-plane connections comprise a combination of male type pin connectors and female type socket connectors.

5. The rack unit system of claim 1, wherein the 1U or 2U rack unit comprises an Ethernet switch.

6. The rack unit system of claim 1, further comprising:
   at least one slot attached to or formed on the back side; and
   a connector in the at least one slot for receiving a selectively insertable cooling unit, wherein the cooling unit facilitates airflow through the plurality of openings in the back side and a plurality of openings in the left side, the right side, and the front side.

7. The rack unit system of claim 6, wherein the selectively insertable cooling unit comprises a field replaceable fan, wherein the connector facilitates power and alarm data between the rack unit and the field replaceable fan, wherein the airflow is directed between the front side and the back side and wherein the cooling modules include one or more pins that interface to the one or more slots for receiving power and instructions comprising when to turn on/off.

8. The rack unit system of claim 1, further comprising:
   a second set of a plurality of openings disposed near the power supply drawing in airflow for the power supply such that the airflow avoids the associated bottom-plane circuit boards.

9. The rack unit system of claim 1, wherein the power supply is modular and field replaceable.

10. A modular system, comprising:
    a housing comprising a front side, a back side, a left side, a right side, a top side, and a bottom side, wherein the physical housing comprising 1RU (Rack Unit) or 2RU of height;
    top-plane connections located at or near the back side and the top side;
    bottom-plane connections located at or near the back side and the bottom side, wherein the top-plane connections and the bottom-plane connections leave the back side substantially unobstructed for airflow there through;
    at least one module comprising a first right-angle connector configured to interface to one of the bottom-plane connections and a second right-angle connector configured to interface to one of the top-plane connections;
    a first plurality of openings in the back side located in substantially unobstructed portions of the back side thereby enabling airflow through the housing;
    a power supply located internal to the housing and in a same horizontal plane as the at least one module;

a baffle blocking airflow from the front side from the power supply, wherein the baffle is located from the top side to the bottom side of the physical housing thereby separating airflow in the physical housing; and a second set of a plurality of openings disposed near the power supply drawing in airflow for the power supply such that the airflow avoids the at least one module, wherein the at least one module is selectively insertable through the front side.

11. The modular system of claim 10, wherein the top-plane connections comprise data connections and the bottom-plane connections comprise power connections.

12. The modular system of claim 11, wherein the top-plane connections comprise pin connectors and the bottom-plane connections comprise socket connectors.

13. The modular system of claim 10, further comprising:
at least one slot attached to or formed on the back side; and
a connector in the at least one slot for receiving a field replaceable fan, wherein the field replaceable fan facilitates airflow through the plurality of openings in the back side and a plurality of openings in the left side, the right side, and the front side.

14. The modular system of claim 10, wherein the power supply is modular and field replaceable.

15. A method, comprising:
inserting a module comprising a pair of right-angle connectors thereon into a high-density 1U or 2U rack unit;
selectively inserting and connecting the module via the pair of right-angle connectors to connections in the high-density 1U or 2U rack unit, wherein the pair of connections in the high-density 1U or 2U rack unit leave a substantial portion of a back side of the high-density 1U or 2U rack unit unobstructed for airflow;
operating a selectively insertable cooling unit at or near the back side to draw airflow through the high-density 1U or 2U rack unit through the unobstructed substantial portion of the back side; and
operating a second cooling unit at or near a side to draw airflow through a side of the high-density 1U or 2U rack unit to cool a power unit which is located in a same horizontal plane as the module and which has airflow separate from the module through a baffle in the high-density 1U or 2U rack unit, wherein the baffle is located from a top side to a bottom side of the physical housing thereby separating airflow in the high-density 1U or 2U rack unit.

16. The rack unit system of claim 1, further comprising:
a first set of one or more cooling units to facilitate airflow from the front side to the back side and over the associated bottom-plane circuit boards; and
a second set of one or more cooling units to facilitate airflow from one of the right side and the left side to the back side and over the power supply.

17. The modular system of claim 10, further comprising:
a first set of one or more cooling units to facilitate airflow to the plurality of openings and over the associated bottom-plane circuit boards; and
a second set of one or more cooling units to facilitate airflow from the second set of the plurality of openings and over the power supply.

* * * * *